Nov. 29, 1960 J. I. PANKOVE 2,962,396

METHOD OF PRODUCING RECTIFYING JUNCTIONS OF PREDETERMINED SIZE

Original Filed March 23, 1953 2 Sheets-Sheet 1

INVENTOR.
JACQUES I. PANKOVE

BY W. S. Hill

AGENT

INVENTOR.
JACQUES I. PANKOVE
BY W.S. Hill
AGENT

United States Patent Office 2,962,396
Patented Nov. 29, 1960

2,962,396

METHOD OF PRODUCING RECTIFYING JUNCTIONS OF PREDETERMINED SIZE

Jacques I. Pankove, Princeton, N.J., assignor to Radio Corporation of America, a corporation of Delaware Original application Mar. 23, 1953, Ser. No. 343,945. Divided and this application Aug. 28, 1959, Ser. No. 836,770

11 Claims. (Cl. 148—1.5)

Figures 1, 2, 3, 4, 5, 6:
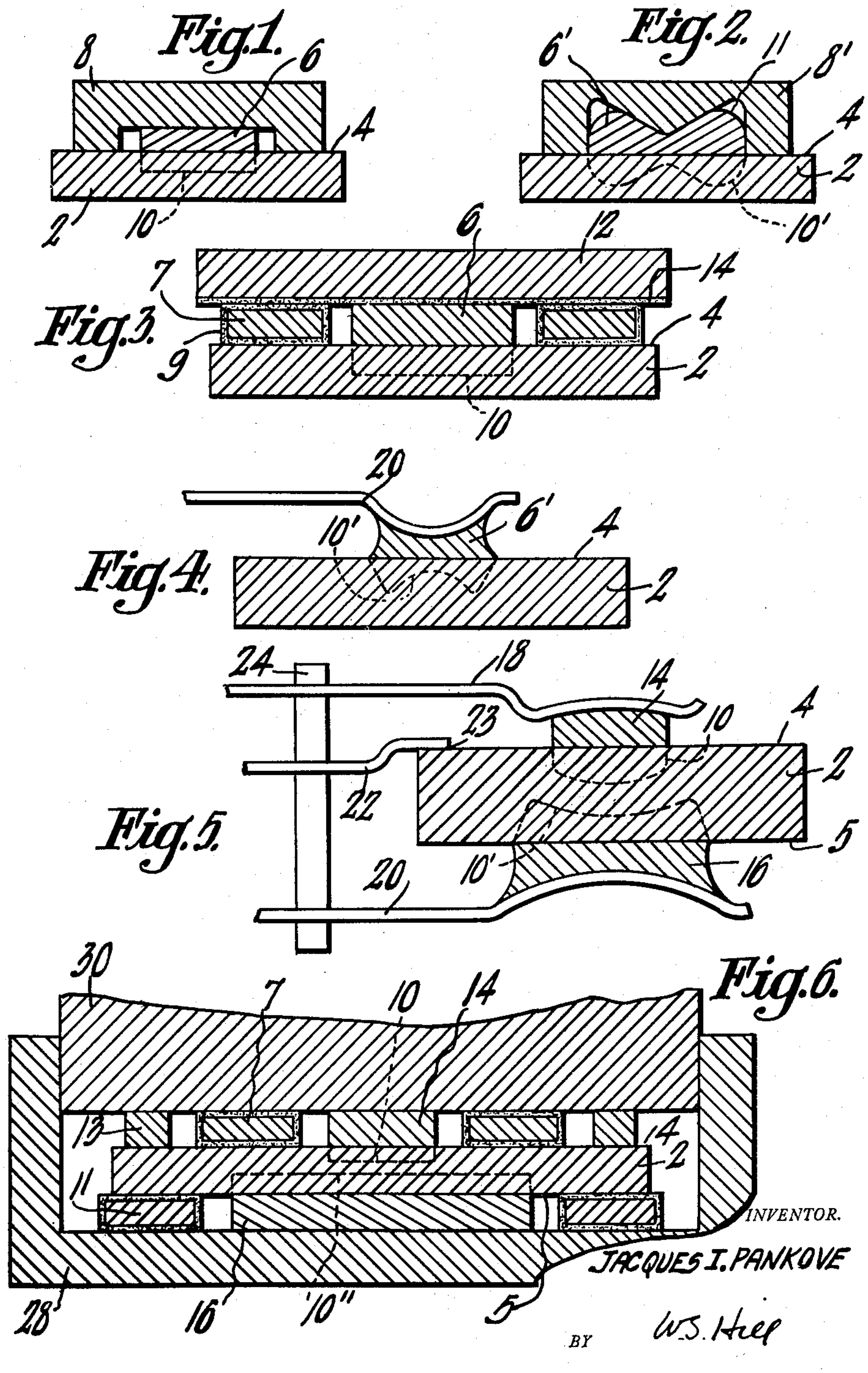

This application is a division of application Serial Number 343,945, filed March 23, 1953.

This invention relates to improved semi-conductor devices and methods for making such devices, and more particularly, to semi-conductor devices having one or more P-N rectifying junctions of predetermined shape.

It is known to make devices called transistors by fusing two relatively small bodies of impurity-yielding metal of one conductivity type, upon opposite sides of a relatively thin wafer of semi-conducting material such as germanium or silicon which has been prepared so as to be of opposite conductivity type. P-N rectifying junctions are formed near the areas of physical junction between the fused bodies of impurity-yielding metal and the wafer.

It has previously been shown that in such a device electric current is conducted from one such junction to the other by means of electrons or "holes," referred to as electric current carriers. It has also previously been shown that these electric current carriers, electrons and holes, move through the semi-conducting body from one junction to the other principally by means of random diffusion. Since it is important that as many as possible of the carriers that leave one junction be intercepted and collected at the other junction, and since it is also important that all of the current carriers leaving one junction at any one instant, arrive at the other junction at another given instant in unison, efforts have been made to design the geometry of the junctions relative to each other to accomplish these ends. Generally, these efforts have been directed toward placing the two junctions as close together as possible and making one junction considerably larger than the other.

Accordingly, an object of the invention is to provide an improved semi-conductor device.

Another object of the invention is to provide an improved device having P-N rectifying junctions which cause the device to have electrical characteristics of improved uniformity.

Another object of the invention is to provide a device including P-N rectifying junctions having predetermined shapes.

Another object of the invention is to provide an improved semi-conductor device having electrical characteristics of improved uniformity and being capable of dissipating a relatively large amount of heat.

Another object of the invention is to provide an improved method for making a semi-conductor device having one or more P-N rectifying junctions.

Another object of the invention is to provide an improved method for making a semi-conductor device capable of a relatively large power output and of dissipating a relatively large amount of heat.

According to the present invention, an improved semi-conductor device is provided by a method which includes forming closely spaced P-N rectifying junctions having a desired predetermined shape.

The invention will be more easily understood by reference to the following detailed description and to the drawings, of which:

Figures 1, 2, 3, and 4 are schematized, cross-sectional, elevational views of germanium wafers illustrating the production of P-N rectifying junctions according to respective embodiments of the invention.

Figures 5 and 6 are schematized, cross-sectional, elevational views of germanium wafers illustrating the production of respective devices according to the invention.

Figures 7, 8, 9, and 10 are schematized, cross-sectional elevational views of a germanium wafer treated according to another embodiment of the invention to form a device adapted to dissipate relatively large amounts of heat.

Similar reference characters have been applied to similar elements throughout the drawings.

In one method of making a junction type transistor, a small body of an impurity-yielding material is placed upon the surface of a semi-conducting material and heated above the melting point of the impurity-yielding material, but below the melting point of the semi-conducting material. At this temperature, surface tension forces constrict the impurity-yielding material toward an approximately spherical shape. The impurity-yielding material wets the semi-conducting material and penetrates by diffusion beneath the surface of the semi-conducting material.

When the impurity-yielding material is permitted to contract into a spherical shape, the only portion of the material in contact with the semi-conducting body is a relatively small area on the bottom of the sphere. Alloying thus begins only within the contact area and the impurity-yielding material begins at first to penetrate the semi-conductor only at this area. As the process continues the impurity-yielding substance wets the surface of the semi-conductor further and the molten sphere flattens out into the form of half of an ellipsoid. Alloying then takes place over a larger area.

It has been observed that, when alloying is carried out as described above on a semi-conductive body with a flat surface, the alloying front and the P-N junction around the periphery thereof are curved concavely with respect to the surface of the body into which the impurity-yielding material has been alloyed. It appears that the depth of alloying and diffusion directly beneath any point of contact between the semi-conductive body and the molten quantity of impurity-yielding material is determined largely by the height of the melted mass of material directly above that point.

Accordingly, the invention provides a method for producing a P-N rectifying junction having a desired shape by means of restraining a molten mass of impurity-yielding material in contact with a surface of a semi-conductive body to cause that surface of the impurity-yielding material opposite the interface between the material and the body to assume a predetermined shape. There is thus formed within the semi-conductive body a P-N rectifying junction having a shape similar to a mirror image of the predetermined shape produced upon the surface of the molten material.

One embodiment of the invention is illustrated in Figure 1 which shows a body 2 of germanium upon one surface 4 of which is disposed a disc-shaped pellet 6 of indium. A cup-shaped graphite weight 8 completely surrounds the exposed surfaces of the indium pellet and firmly holds the pellet against the germanium surface. The entire assembly is heated to about 500° C. for about twenty minutes. The graphite weight restricts the shape of the molten mass of indium so that it cannot assume the normal spherical or ellipsoidal shape; therefore, the diffusion of indium into the germanium body takes place at a substantially uniform rate and to a substantially uniform depth over the entire area of contact between the pellet and the body.

There is thus formed a P-N rectifying junction 10 comprising a substantially flat surface over most of its area. When two such junctions are formed upon opposite sides of a thin germanium wafer, the passage of electric current carriers between them will be more uniform than in the case of two hemi-spherical or ellipsoidal junctions disposed in a convex relationship to each other since the distance between the junctions is more uniform over their effective areas.

The weight 8 may be of a material other than graphite, that has a relatively high melting point and is not wetted by the molten indium or other impurity-yielding material. Graphite has been selected in the example since it readily fulfills these two conditions, and may be easily removed from the device after the heating process.

Figure 2 illustrates another shape easily obtainable in a P-N rectifying junction according to the invention. In Figure 2 a body of germanium 2 is shown having disposed upon a surface 4 a mass of molten indium 6'. The indium is constricted to a concave, dished shape by a suitably formed graphite weight 8'. The dotted line 10' represents a surface defined by all points within the germanium body having a given concentration of diffused indium atoms. This surface is parallel to and may be coextensive with a P-N rectifying junction formed within the germanium body by the diffusion of indium atoms. It should be noted that the surface represented by the dotted line 10' is approximately a mirror image of the upper surface 11 of the molten indium body.

Figure 3 illustrates another embodiment of the invention in which a P-N rectifying junction is formed having a shape similar to that of the junction described in connection with Figure 1. In Figure 3 there is shown a body of germanium 2 having disposed on a surface 4 thereof a molten body of indium 6 and a metal washer 7 coated with carbon 9. A metallic body 12 having a carbon coating 14 upon one surface thereof rests upon the washer and the indium body. The entire assembly is heated to about 500° C. to form a P-N rectifying junction 10 by the diffusion of indium into the germanium body. The carbon coated washer and metallic body serve to restrict the shape of the indium body in its molten state in a manner similar to that of the graphite block 8 shown in Figure 1. There is thus formed a P-N rectifying junction similar in shape to the junction described in connection with Figure 1.

Figure 4 illustrates another method for forming a P-N rectifying junction having a shape similar to the shape of the junction formed according to the method illustrated in Figure 2. In Figure 4 there is shown a body of germanium 2 having disposed upon a surface 4, a molten mass of indium 6'. The indium is constricted to a concave, or dished shape by means of an electrode 20, which may be of nickel, and which is wetted by the indium. Upon cooling the electrode becomes fused and firmly attached to the indium. The combination of the adhesive forces between the indium and the surface of the electrode and the surface tension forces of the molten indium, keep the indium centered with respect to the electrode. Diffusion of the indium into the germanium, and the formation of a curved P-N rectifying junction 10' take place in exactly similar manner as described in connection with Figure 2. In addition, the device formed in this embodiment also includes an electrode attached firmly to the indium pellet, thus permitting utilization of the device in a circuit without further treatment involving heat.

A preferred embodiment of the invention, however, is illustrated in Figure 5 which shows the production of a transistor device according to the invention. In Figure 5 there is shown a wafer 2 of germanium upon opposite surfaces 4 and 5 of which are disposed two discs 14 and 16 of indium. The discs are held in place by the electrodes 18 and 20 which are composed of a material, such as nickel, capable of being wetted by molten indium. A third electrode 22 having at least a surface 23 of a material such as tin that will form a non-rectifying connection with germanium, is placed in contact directly with the germanium wafer. The three electrodes are supported by any suitable means such as the heat-resisting supporting block 24 shown which may be of nickel. The entire assembly is heated in a non-oxidizing atmosphere at about 500° C. for about twenty minutes to form the P-N rectifying junctions 10 and 10' and simultaneously to fuse the electrodes 18 and 20 to the indium bodies and the electrode 22 to the germanium wafer. The device may be conventionally etched, mounted and potted, and incorporated into a circuit.

There is thus formed a transistor device having two oppositely disposed, curved P-N rectifying junctions. The one junction 10 is convex and the other junction 10' is concave, each with respect to the other, the two being substantially parallel over most of their effective areas. When the device is employed in a circuit in a manner to cause electric current carriers to move away from the first junction a maximum proportion of the carriers will arrive at the second junction since it is disposed partially to surround the first junction.

Figure 6 illustrates the production of a semi-conductor device according to another embodiment of the invention. In Figure 6 there is shown a germanium body 2 having disposed upon its opposite sides 4 and 5 respectively, two bodies of indium 14 and 16, and two carbon coated metal washers 7 and 11. A metal ring 13 which may be of tin and is adapted to form a non-rectifying connection with the germanium body is disposed in contact with one surface 4 of the body. This assembly is supported in a carbon vessel 28 and is firmly held in place by a carbon block 30. The entire assembly is heated at about 500° C. for about twenty minutes to form two P-N rectifying junctions represented by the dotted lines 10 and 10'' respectively. The carbon vessel, the carbon block and the two carbon washers serve to restrict the two bodies of indium while they are in a molten state during the process.

There is thus formed a device comprising two oppositely disposed P-N rectifying junctions having their respective effective surfaces substantially parallel. Simultaneously with the production of the two junctions, the metallic ring 13 is fused to the germanium body to form a non-rectifying connection therewith. Suitable electric leads may be attached to the indium bodies and the metallic ring to incorporate the device in a circuit.

A power transistor may be produced according to the present invention as described in the following embodiments, in which there is illustrated the production of transistors having P-N rectifying junctions comprising substantially flat surfaces throughout most of their effective areas. It should be understood that, by suitably shaping the heat-conducting elements described below, P-N rectifying junctions of any desired shape may be formed.

Figures 7, 8:
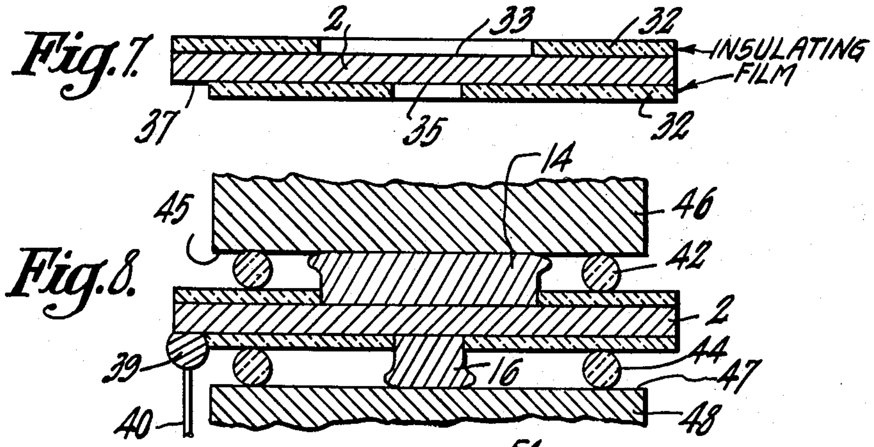

Figure 7 shows a wafer of N-type germanium 2 bearing over most of its surface a chemically inert coherent film 32 of a material such as silicon monoxide which has been evaporated thereon in accordance with the method described in a co-pending application which has issued as U.S. Patent 2,796,562. Three separate areas 33, 35 and 37, of the surface of the wafer are not covered by the film, but remain exposed for the purpose of attaching suitable electrodes to the wafer. Small discs of indium 14 and 16, as shown in Figure 8, are placed in contact with the exposed areas 33 and 35, respectively, and a dab of tin 39 to which is connected an electrical lead 40, is placed in contact with the exposed area 37 of the wafer. Spacing washers 42 and 44, which may be of mica, are placed around the discs of indium, and copper blocks 46 and 48 are placed in contact with the indium discs. The copper blocks exert pressure on the indium discs and are firmly pressed together. The spacers prevent the copper blocks from deforming the indium to too great an extent. The entire assembly is then heated in an inert or reducing atmosphere for the time and at the temperature required to form rectifying junctions. Although a heat treatment of 500° C. for about 10 minutes gives satisfactory results, other times and temperatures may also be used. This heating also serves to fuse the indium to the surfaces 45 and 47 of the copper blocks and to fuse the base tab 39 to the wafer, thus forming a semi-conductor device which may then be encased in a resinous material according to the usual practice.

Figures 9, 10:
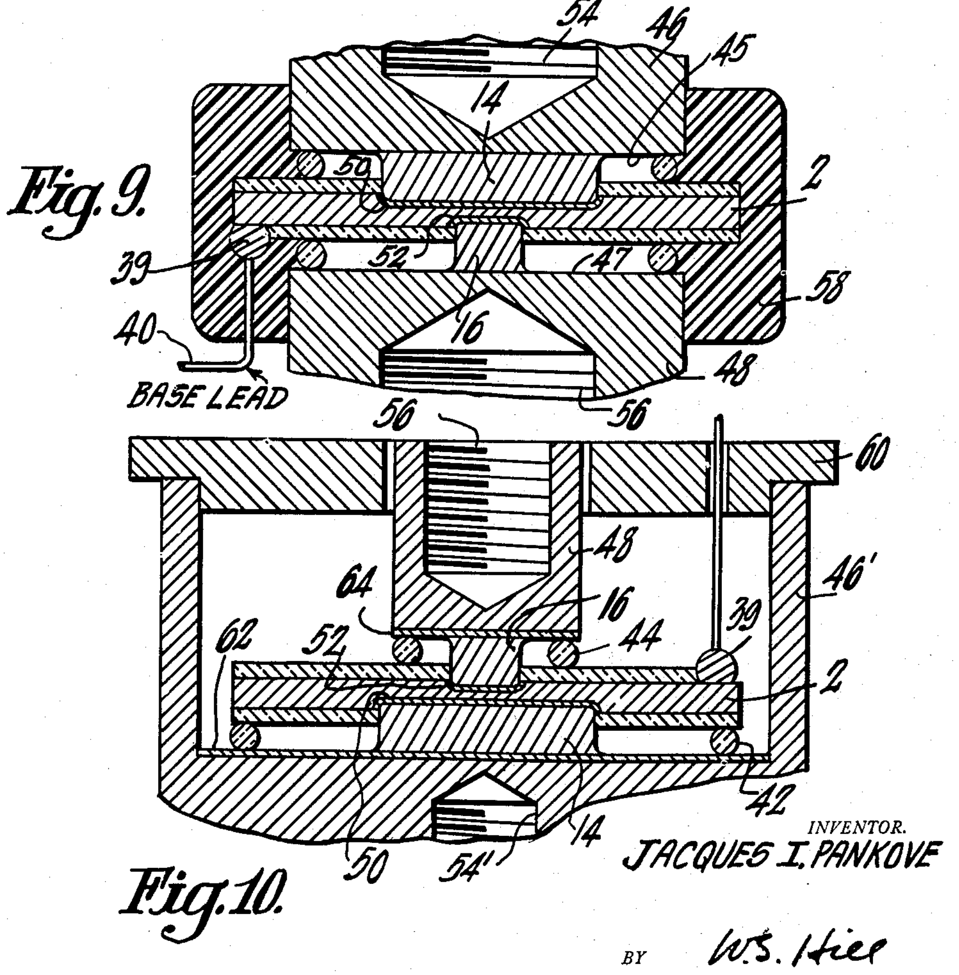

Figure 9 shows a device formed in accordance with the invention. Rectifying junctions 50 and 52 have been formed by diffusion of the indium into the germanium, and the indium electrodes 14 and 16 have fused to the surfaces 45 and 47, respectively, of the copper blocks. The dab of tin 39 has fused to the surface of the wafer without forming a rectifying junction thus providing an electrical contact for the base lead 40. The copper blocks 46 and 48 are shown having tapped holes 54 and 56 to which may be secured cooling fins of any desired type. The device has been encased within a body of a thermosetting plastic material 58 by any well-known method. The envelope of plastic serves to protect it from physical distortion, corrosion, atmospheric moisture and any other harmful effects.

Figure 10 illustrates a second and slightly different embodiment of the invention. In this embodiment the copper block 46' is made in the form of a cup into which is placed the germanium wafer 2, the discs of indium 14 and 16, the spacing washers 42 and 44, the dab of tin 39 and the second copper block 48. These items are held in place by a centering spacer 60 that fits in place over the open end of the copper block 48. The assembly is then heated to form the junctions 50 and 52 and simultaneously to bond the indium to the copper surfaces and the tin to the germanium surface in exactly similar manner as described above. After the forming process, the lid 60 is removed and the copper block 46' is filled with a suitable thermo-setting plastic material. Suitable cooling means may be attached to the copper blocks by means of the tapped holes 54' and 56 respectively.

Figure 10 also shows thin films of gold 62 and 64 that have been electroplated or evaporated upon the surfaces of the copper blocks to prevent diffusion of copper through the indium and into the germanium. The reasons for these films of gold will be explained later.

The copper blocks, which may also be of any other electrical and heat-conducting material, serve not only to connect cooling means to the electrodes of a semi-conductor device, but also to provide electrical connections to the electrodes.

It should be understood that the invention is not limited to the production of a semi-conductor device comprising the particular materials described above but that it is quite generally applicable to the production of all kinds of junction type semi-conductor devices that are formed by diffusing one material into another. Silicon is an example of another semi-conducting material suitable for use as a semi-conducting body in a device. Gallium, aluminum, bismuth and antimony are examples of other materials suitable for use as junction-forming impurity materials in such semi-conductor devices.

In the practice of the invention according to the embodiment illustrated by Figure 10 and when using heat-conducting blocks made of copper, it has been found that there is some tendency for relatively small quantities of copper to diffuse through the indium into the germanium, producing an undesirable effect upon the rectifying junctions. This may easily be avoided by electroplating or evaporating a thin film of gold upon that part of the surface of the copper block that is to come into contact with the indium, as shown at reference numerals 62 and 64 in Figure 10. Since gold has a relatively large atomic diameter, much larger than copper, it has a relatively low rate of diffusion and acts as a barrier to reduce the diffusion of copper into the indium toward the germanium. It is also possible to prevent such diffusion by using a suitable material such as gold to form the entire heat conducting blocks 18 and 20 in the figures; however, since gold is relatively expensive, it is preferred to make the blocks of copper and to electroplate a minute quantity of gold upon the critical surface areas.

It is not essential to plate gold upon the surface of the copper blocks. The practice of the invention as described above produces a junction type semi-conductor device having protected junction areas and advantageous characteristics. The use of an electroplated gold film on the copper surface is a refinement further to improve the device described.

The production of power transistors according to the present invention is related to the invention described in my co-pending application referred to above which comprises the use of the insulating coherent film 32, as shown in Figure 7 on the surface of the base wafer. Without such a film damage would occur during the forming process to that part of the rectifying junction disposed along the surface of the wafer. In previous devices produced without the insulating film, further steps such as etching were necessary in order to repair such damage. In this embodiment of the present invention, no further treatment is required in respect of the junction areas after the forming process since the insulating film prevents external damage.

The practice of the invention as described in connection with Figures 1 through 6 may also be advantageously combined with the invention described in my co-pending application referred to. However, since the examples illustrated by Figures 1 through 6 may be easily etched, the use of an evaporated film on the surface of the semi-conducting bodies is not essential.

It should be understood that the invention is not limited to the particular examples described, but is intended to include other similar methods for controlling the shape of a molten body of indium during the alloy-diffusion process in forming a semi-conductor device. In particular, it should be noted that by suitable variations of the techniques described, P-N rectifying junctions having a large variety of shapes may be readily produced.

There have thus been described improved semi-conductor devices and methods for producing them, which devices comprise P-N rectifying junctions of predetermined shape and may be readily adapted to the dissipation of a relatively large amount of heat.

What is claimed is:

1. A semi-conductor device comprising a body of semi-conducting material, an electrode diffused into a portion of one surface of said body, an insulating coherent film disposed over the portions of said surface adjacent to said electrode, and a heat conducting body fused to the surface of said electrode.

2. A device according to claim 1 in which said heat conducting body is provided with a threaded recess adapted to have cooling means attached thereto.

3. A device according to claim 1 in which said heat conducting body is a copper body.

4. A device according to claim 3 in which a film of gold is disposed along that part of the surface of said copper body that is fused to said electrode.

5. A semi-conductor device comprising a body of semi-conducting material, an electrode diffused into a portion of one surface of said body, an insulating coherent film disposed over the portions of said surface adjacent to said electrode, a heat conducting body fused to the surface of said electrode, and a spacing washer disposed between said heat conducting body and said semi-conducting body.

6. The method of making a semiconductor device comprising the steps of placing a mask of inert material against a body of semiconductor material so as to be in close contact with the surface thereof, the mask defining a restricted surface area, placing a material selected from the class of donor and acceptor materials within said area, applying heat so as to melt said material and cause it to penetrate the body of semiconductor material, applying pressure to said molten material within the mask so as to overcome the surface tension of the molten material and cause it to act on substantially all portions of the body of semiconductor material exposed within said mask, and removing said mask after the molten material has cooled.

7. The method of making a semi-conductor device comprising masking a predetermined portion of the surface of a solid semi-conducting body, applying an adherent and coherent insulating film to certain unmasked portions of said surface, unmasking said masked portion, placing electrode material in contact with said newly unmasked portion, placing a heat conducting body in contact with said electrode material, and heating all said bodies to a temperature sufficient to fuse said electrode material.

8. The method according to claim 7 in which said heat conducting body is a copper body, and which includes the step of placing a film of gold upon that portion of the surface of said body that is later placed in contact with said electrode material.

9. The method of making a semi-conductor device comprising masking a predetermined portion of the surface of a solid semi-conducting body, applying an adherent and coherent insulating film to certain unmasked portions of said surface, unmasking said masked portion, placing electrode material in contact with said newly unmasked portion, placing a spacing washer in contact with said insulating film and disposed adjacent to said electrode material, placing a heat conducting body in contact with said electrode material and with said washer, and heating all said bodies to a temperature sufficient to fuse said electrode material.

10. The method of making a semi-conductor device comprising masking at least two predetermined portions of the surface upon opposite sides of a semi-conducting body, applying an adherent and coherent insulating film to certain unmasked portions of said surface, unmasking said masked portions, placing bodies of electrode material in contact with said newly unmasked portions, placing a cup-shaped heat-conducting metallic body in contact with one of said electrode material bodies, placing an elongated heat-conducting metallic body in contact with another of said electrode material bodies, placing spacing means between the rim of said cup-shaped body and said elongated body, and heating all said bodies together to a temperature sufficient to fuse said electrode material.

11. The method of making a semi-conductor device comprising masking at least two predetermined portions of the surface of a semi-conducting body, applying an adherent and coherent insulating film to certain unmasked portions of said surface, unmasking said masked portions, placing a body of electrode material in contact with one of said newly unmasked portions, placing a body of a material that will form a non-rectifying connection with said semi-conducting body in contact with another of said newly unmasked portions, placing a heat conducting body in contact with said electrode material, and heating all said bodies together to a temperature sufficient to fuse said electrode material and said material that will form a non-rectifying connection.

References Cited in the file of this patent

UNITED STATES PATENTS

| | | |
|---|---|---|
| 2,742,383 | Barnes et al. | Apr. 17, 1956 |
| 2,743,201 | Johnson et al. | Apr. 24, 1956 |
| 2,759,133 | Mueller | Aug. 14, 1956 |